(12) United States Patent
Umisedo et al.

(10) Patent No.: US 7,368,734 B2
(45) Date of Patent: May 6, 2008

(54) ION BEAM MEASURING METHOD AND ION IMPLANTING APPARATUS

(75) Inventors: Sei Umisedo, Kyoto (JP); Nariaki Hamamoto, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 239 days.

(21) Appl. No.: 10/574,281

(22) PCT Filed: Dec. 28, 2004

(86) PCT No.: PCT/JP2004/019833

§ 371 (c)(1),
(2), (4) Date: Mar. 31, 2006

(87) PCT Pub. No.: WO2005/066658

PCT Pub. Date: Jul. 21, 2005

(65) Prior Publication Data

US 2007/0023674 A1 Feb. 1, 2007

(30) Foreign Application Priority Data

Jan. 6, 2004 (JP) .............................. 2004-001006

(51) Int. Cl.
*H01J 3/10* (2006.01)

(52) U.S. Cl. .................................. 250/492.21; 250/397

(58) Field of Classification Search ........... 250/492.21, 250/397
See application file for complete search history.

(56) References Cited

U.S. PATENT DOCUMENTS

| 6,763,316 B2 * | 7/2004 | Evans ........................ 702/134 |
| 2004/0195528 A1 * | 10/2004 | Reece et al. ........... 250/492.21 |

FOREIGN PATENT DOCUMENTS

| JP | 56-42115 | | 4/1981 |
| JP | 4-319242 | | 11/1992 |
| JP | 04319242 A | * | 11/1992 |
| JP | 5-89811 | | 4/1993 |
| JP | 10-177074 | | 6/1998 |
| JP | 10-319196 | | 12/1998 |
| JP | 10319196 A | * | 12/1998 |
| JP | 2969788 | | 8/1999 |
| JP | 3358336 | | 10/2002 |

* cited by examiner

*Primary Examiner*—Robert Kim
*Assistant Examiner*—Michael Maskell
(74) *Attorney, Agent, or Firm*—Finnegan, Henderson, Farabow, Garrett & Dunner, L.L.P.

(57) ABSTRACT

A beam current density distribution in y direction of an ion beam 4 at a position of a forestage beam restricting shutter 32 is measured by measuring a change in a beam current of the ion beam 4 incident on a forestage multipoint Faraday 24 by passing an outer side of a side 34 of the shutter 32 while driving the forestage beam restricting shutter 32 in y direction by a forestage shutter driving apparatus 36. Further, a beam current density distribution in y direction of the ion beam 4 at a position of a poststage beam restricting shutter 42 is measured by measuring a change in the beam current of the ion beam 4 incident on a poststage multipoints Faraday 28 by passing an outer side of a side 44 of the shutter 42 while driving the poststage beam restricting shutter 42 in y direction by a poststage shutter driving apparatus 46. Further, at least one of an angle deviation, a diverging angle and abeam side in y direction of the ion beam 4 is measured by using a result of the measurement.

10 Claims, 7 Drawing Sheets

ION BEAM MEASURING METHOD AND ION IMPLANTING APPARATUS

TECHNICAL FIELD

The present invention relates to an ion beam measuring method of measuring an angle deviation, a diverging angle and a beam size of an ion beam in y direction orthogonal to x direction in an ion implanting apparatus of a type of parallelly scanning the ion beam in x direction to irradiate to a target and an ion implanting apparatus capable of carrying out the measuring method by using a control apparatus.

BACKGROUND ART

An ion implanting technology holds an important position in a semiconductor fabricating process or the like in recent times.

In implanting ions to a target, for example, a semiconductor substrate, it is known that an implantation characteristic particular in an implantation depth direction is indicated by an implantation angle (incidence angle) relative to a crystal axis of the semiconductor substrate and it is normally requested for the ion implanting technology to enable to execute an ion implanting processing under a condition of preventing the implantation characteristic or positively utilizing the implantation characteristic.

The above-described phenomenon referred to as channeling is provided with a high incidence angle dependency particularly at a vicinity of 0 degree of the incidence angle of ions and therefore, although an incidence angle control with higher accuracy is requested at a vicinity of 0 degree of the incidence angle, the incidence angle control with high accuracy is normally requested at other incidence angle.

Figure 1:
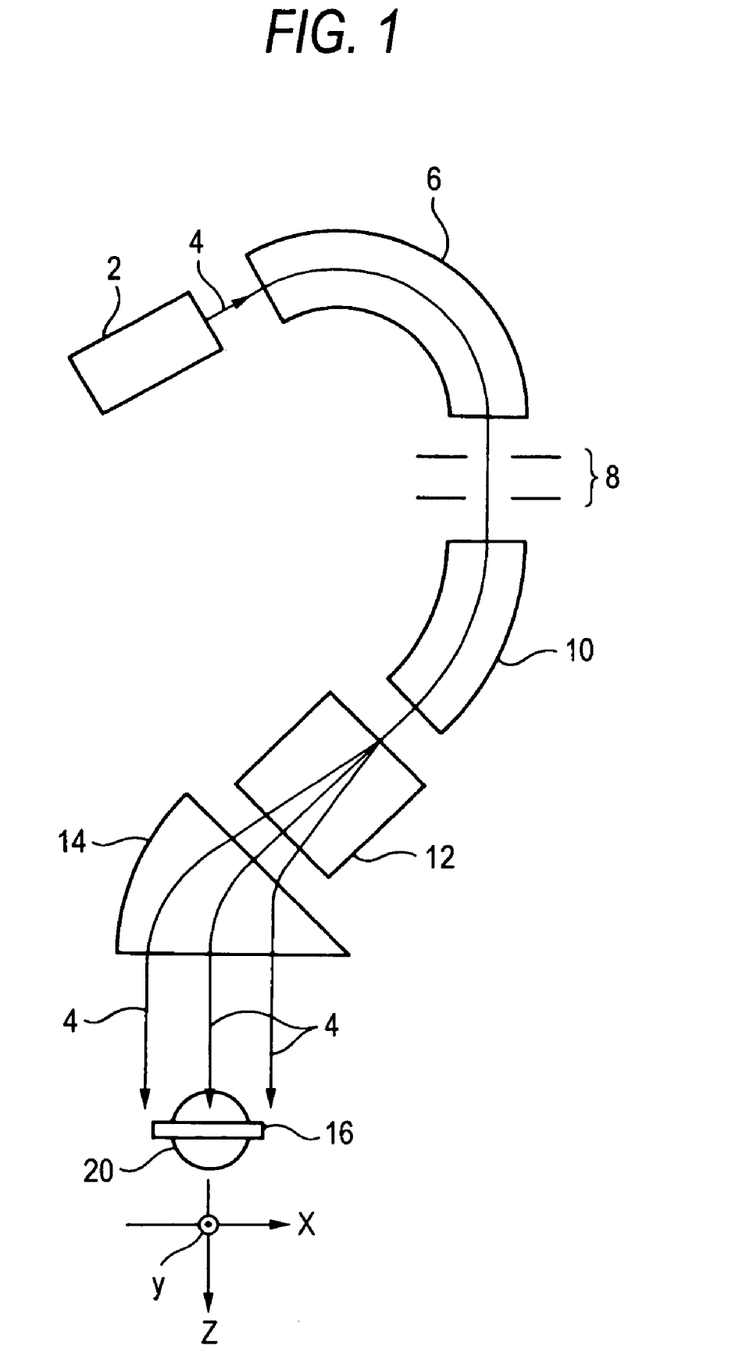
FIG. 1 is an outline view showing an example of an ion implanting apparatus of a background art.

Japanese Patent Gazette No. 3358336 (paragraphs 0002, 0003, FIG. 1) (hereinafter, Patent Reference 1) describes an example of an ion implanting apparatus capable of meeting such a request to some degree. FIG. 1 shows an ion implanting apparatus similar to the ion implanting apparatus described in Patent Reference 1.

The ion implanting apparatus is provided with an ion source 2 for generating an ion beam 4, a mass separator 6 on which the ion beam from the ion source 2 is incident and which separates to sample a desired mass of the ion beam 4 from the ion beam 4, an accelerator/decelerator 8 on which the ion beam from the mass separator 6 is incident and which accelerates or decelerates the ion beam 4, an energy separator 10 on which the ion beam 4 from the accelerator/decelerator 8 is incident and which separates to sample a desired energy of the ion beam 4, a scanner 12 on which the ion beam 4 from the energy separator 10 is incident and which scans the ion beam 4 in x direction (for example, horizontal direction), a beam parallelizer 14 on which the ion beam 4 from the scanner 12 is incident and which bends back the ion beam 4 to parallelize to be in parallel with z axis, mentioned later, and a target driving apparatus 20 (refer also to FIG. 7) for mechanically reciprocating to scan (reciprocating to drive) a target (for example, a semiconductor substrate) 16 in y direction (for example, vertical direction) orthogonal to the x direction or mechanically reciprocating to scan (reciprocating to drive) the target substantially in y direction in a region of irradiating the ion beam 4 from the beam parallelizer 14.

Here, the z axis is defined in a direction orthogonal to the x direction (in other words, x axis) and the y direction (in other words, y axis) and in a direction of a trajectory of the ion beam 4 incident on the target 16 in view of design.

The mass separator 6 is, for example, a mass separating electromagnet for separating the mass of the ion beam 4 by a magnetic field. The accelerator/decelerator 8 is, for example, an accelerator/decelerator tube having a plurality of sheets of electrodes for accelerating or decelerating the ion beam 4 by a static electric field. The energy separator 10 is, for example, an energy separating electromagnet for separating the energy of the ion beam 4 by a magnetic field. The scanner 12 is, for example, a scanning electromagnet for scanning the ion beam 4 by a magnetic field or a scanning electrode for scanning the ion beam 4 by an electric field. The beam parallelizer 14 is, for example, a beam parallelizing electromagnet for parallelizing the ion beam 4. For example, also in reference to FIG. 7, the target driving apparatus 20 includes a holder 18 for holding the target 16 and reciprocates to scan the target 16 held by the holder 18 in the y direction or substantially in the y direction as shown by an arrow mark 22.

By the above-described constitution, ion implantation can be carried out uniformly by irradiating the ion beam 4 having the desired mass and the desired energy to the target 16 while scanning the ion beam 4 parallelly in x direction, mechanically reciprocating to scan the target 16 held at a predetermined angle relative to the ion beam 4 in y direction and uniformly irradiating the ion beam 4 to an entire face of the target 16. The type of using both of electromagnetic scanning of the ion beam 4 and mechanical scanning of the target 16 in this way is referred to as hybrid scanning type.

In this case, ideally, inspecting apparatus on a beam line of the ion beam 4, for example, the mass separator 6, the energy separator 10, the scanner 12 and the beam parallelizer 14 are designed to deflect the ion beam one-dimensionally only in x direction and not to deflect the ion beam 4 in y direction. Therefore, a surface of the target is irradiated with the ion beam 4 by a constant incidence angle by accurately controlling a parallelism of the ion beam 4 in x direction.

Figure 7:
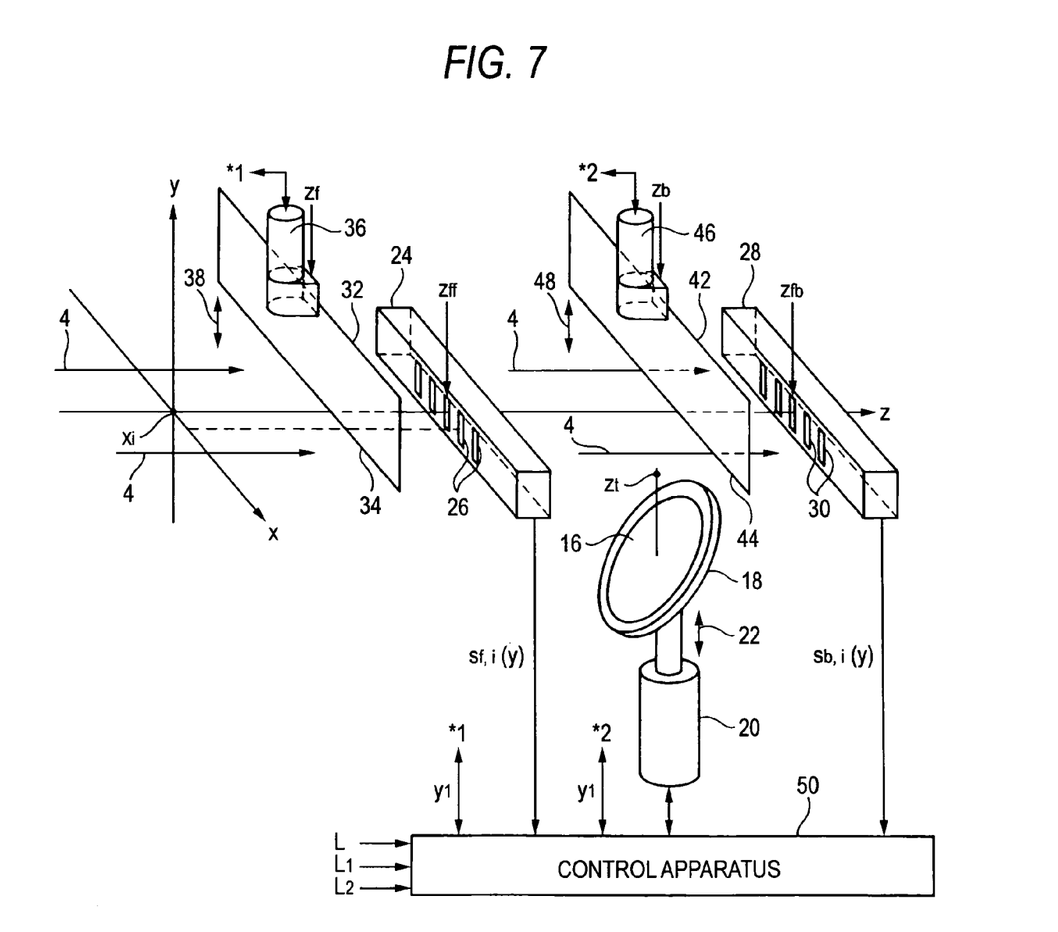
FIG. 7 is a view showing an essential portion of an embodiment of the ion implanting apparatus for embodying an ion beam measuring method according to the invention.
Figure 10:
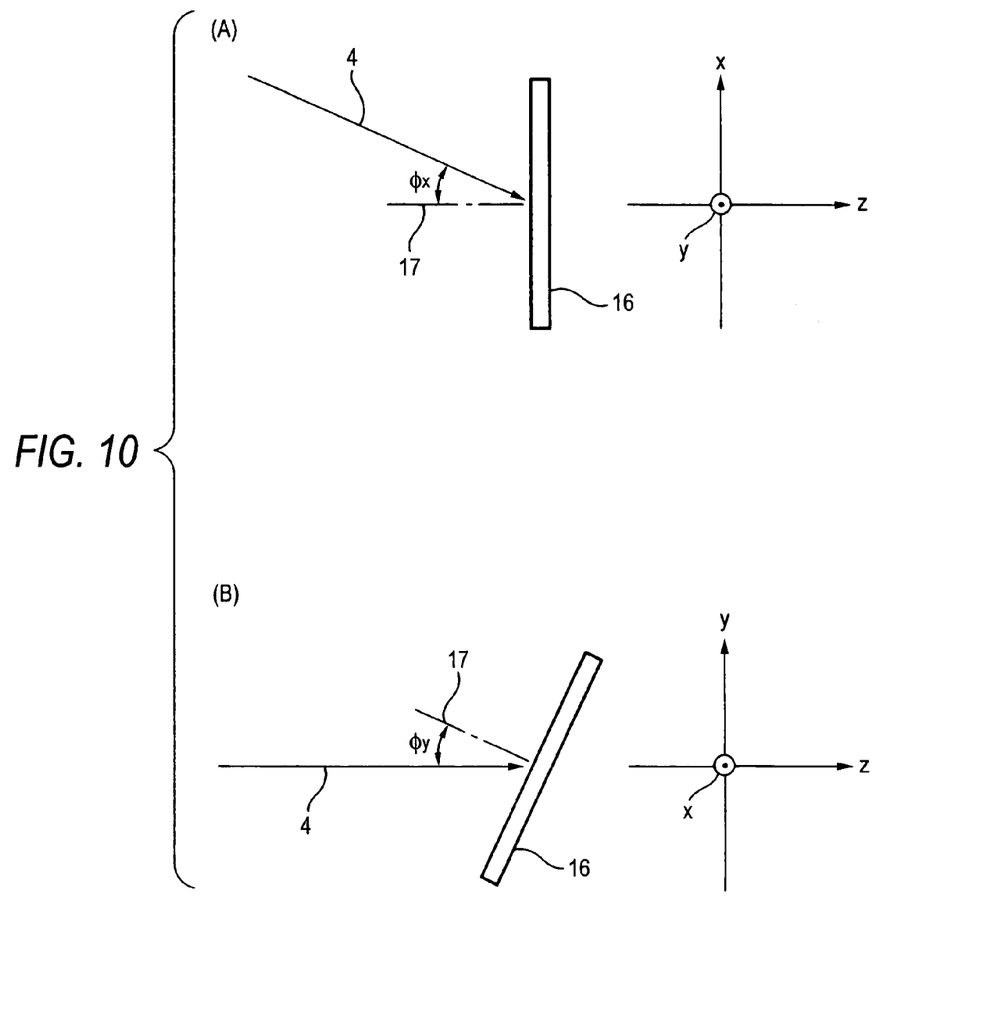
FIG. 10 illustrates diagrams showing an example of an incidence angle of the ion beam to a target.

Here, the incidence angle of the ion beam 4 relative to the target 16 is a relative angle between the target 16 and the ion beam 4, specifically, refers to an angle made by a perpendicular line erected on the surface of the target 16 and the ion beam 4. Explaining further in details, in the incidence angle, there are an incidence angle $\phi_x$ in x direction as in an example shown in FIG. 10A (that is, in x-z plane) and an incidence angle $\phi_y$ in y direction as in an example shown in FIG. 10B (that is, in y-z plane). Numeral 17 designates the perpendicular line. For example, the target 16 shown in FIG. 7 is an example of a case in which the incidence angle $\phi_y$ in y direction is held to be larger than 0 degree similar to the example of FIG. 10B.

Figure 2:
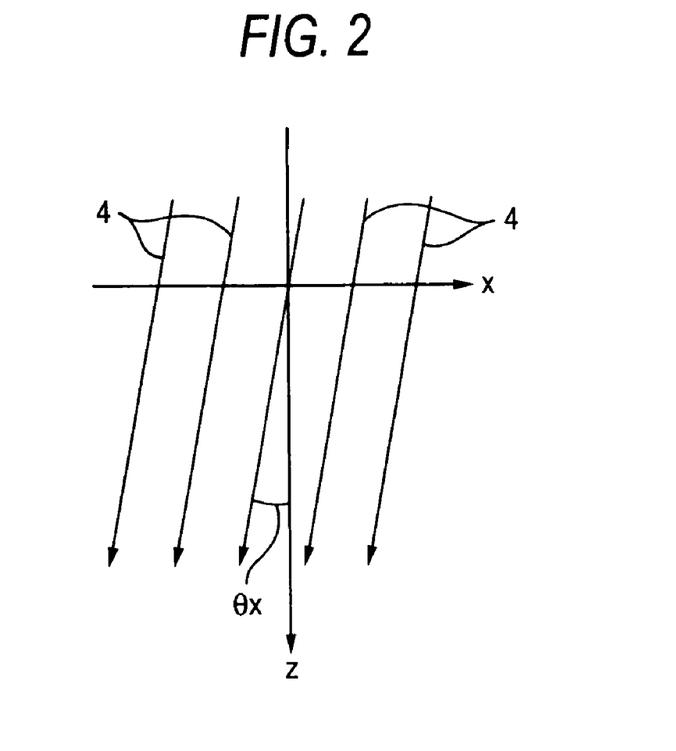
FIG. 2 is a diagram showing an example of a parallelism $\theta_x$ of an ion beam.

As in an example shown in FIG. 2, a parallelism of the ion beam 4 in x direction refers to an angle $\theta_x$ made by a trajectory actually tracked in x-z plane by the scanned and parallelized ion beam 4 and the z axis direction. Therefore, $\theta_x=0°$ in an ideal case in which the scanned and parallelized ion beam 4 tracks a trajectory completely in parallel with z axis. Further, the parallelism $\theta_x$ in the x direction and the incidence angle $\phi_x$ in the x direction are much related to each other.

Figure 3:
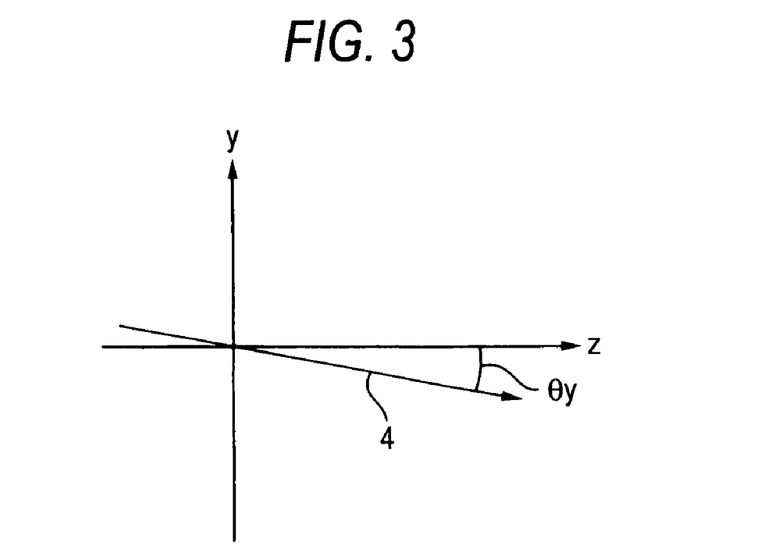
FIG. 3 is a diagram showing an example of an angle deviation $\theta_y$ in y direction of the ion beam.

Further, as in an example shown in FIG. 3, an angle made by a trajectory actually tracked in y-z plane by the scanned and parallelized ion beam 4 and z axis direction is designated by notation $\theta_y$ and is referred to as an angle deviation in y direction of the ion beam 4 in the specification. Therefore, for example, in an ideal case in which the scanned and parallelized ion beam 4 tracks a trajectory completely in parallel with z axis, $\theta_y=0°$. Further, the angle deviation $\theta_y$ in the y direction and the incidence angle $\phi_y$ in the y direction are much related to each other.

Generally, as amounts of characterizing a charged particle beam, or the ion beam 4 in this case, other than a total beam current, there are (a) a center trajectory tracked by a center of the ion beam 4 having a beam current density distribution, (b) a beam size showing spread of the beam current density distribution in a face perpendicular to the center trajectory, (c) a diverging angle representing a shift in a direction of moving respective constituent ions relative to a direction of the center trajectory of the ion beam 4 and the like. A further specific definition thereof will be mentioned later in reference to FIG. 4 through FIG. 6.

When ion implantation is carried by irradiating the ion beam 4 to the target 16, the most important element as the incidence angle of the ion beam 4 is the incidence angle of the center trajectory of the above-described (a) to the target 16. By setting the incidence angle to a desired value, a large portion of ions constituting the ion beam 4 are incident on the target 16 by a desired incidence angle as an average. However, actually, respective ions constituting the ion beam 4 are respectively provided with diverging angles and therefore, incidence angles of respective ions are present with some width at a surrounding of the incidence angle of the center trajectory.

Therefore, when the control of the incidence angle of the ion beam 4 with higher accuracy is requested, it can be said that first, it is important to enable to control the incidence angle of the center trajectory of the ion beam 4 with high accuracy and successively, it is preferable to enable to control the diverging angle with high accuracy.

A technology capable of partially meeting such a request, Japanese Patent Gazette No. 2969788 (sixth paragraph-eleventh paragraph, FIG. 1 through FIG. 9) (hereinafter, Patent Reference 2) describes a technology in which a forestage multipoints Faraday and a poststage multipoints Faraday constituted by respectively aligning pluralities of detectors for measuring a beam current of the ion beam in a direction of scanning the ion beam (for example, the x direction) are respectively provided on an upstream side and a downstream side of a target, in the two multipoints Faradays, at which position in the beam scanning direction the scanning ion beam is disposed at the same time is measured and from a result thereof, a parallelism in the beam scanning direction of the ion beam in a space between the multipoints Faradays (that is, the parallelism θx in the x direction) is measured.

A forestage multipoints Faraday 24 illustrated in FIG. 7 corresponds to the above-described forestage multipoints Faraday and a poststage multipoints Faraday 28 corresponds to the above-described poststage multipoints Faraday. The two multipoints Faradays 24, 28 are respectively provided with the pluralities of detectors (for example, Faraday Cup, not illustrated). In an example of FIG. 7, front sides of the respective detectors are respectively provided with inlets, 26, 30 in a slit-like shape.

The parallelism θx in x direction of the ion beam 4 can be measured by using the forestage multipoints Faraday 24 and the poststage multipoints Faraday 28 in accordance with the technology described in Patent Reference 2. Further, the parallelism θx in x direction of the ion beam 4 can also be controlled with high accuracy by controlling a drive current or a drive voltage of the beam parallelizer 14 in accordance with the technology described in Patent Reference 2 based on the measurement information. Thereby, the incidence angle $\phi_x$ in x direction of the ion beam 4 can accurately be controlled by accurately aligning the center trajectory of the ion beam 4 in x-z plane in z axis direction.

For example, with higher function formation, finer formation or the like of a semiconductor device, the ion implanting technology tends to be requested to enable to control the incidence angle with higher accuracy such that when a further specific example is printed out, ion implantation having a steep implantation boundary can be realized. For that purpose, it is important to also accurately control the incidence angle of the ion beam 4 in y direction orthogonal to the direction of scanning the ion beam (x direction) which has not been problematic in the background art.

Particularly, with miniaturization of a semiconductor fabricating process, it becomes more and more important in the future to transport the ion beam 4 having low energy to irradiate to the target 16 in order to shallow an ion implanting depth, however, when the energy of the ion beam 4 becomes low, the ion beam 4 tends to be strongly provided with the diverging angle by electric repulsion of ions constituting the ion beam 4 (which is referred to as a space charge effect).

Therefore, in order to control the incidence angle with high accuracy, first, it is important to measure and monitor one, preferably both of the angle deviation $\theta_y$ in y direction orthogonal to the direction of scanning the ion beam 4 and the diverging angle.

Further, for example, the above-described case of the ion implanting apparatus of the hybrid scan type, although normally, a speed of scanning the target 16 in y direction is lower than that in scanning the ion beam 4 in x direction, when the scanning speed in y direction is accelerated in order to promote productivity, there is a high possibility that uniformity of implantation to the target 16 is influenced by a width of distributing the ion beam 4 in y direction (beam size). Particularly, when the beam size in y direction of the ion beam 4 becomes extremely small, the uniformity of implantation is deteriorated and therefore, in order to ensure high implantation uniformity, it is also preferable to measure the beam size in y direction of the ion beam 4 and monitor the beam size on the target 16.

However, when a Faraday measuring system quite separately from the forestage multipoints Faraday and the poststage multipoints Faraday which have been provided in the background art for measuring the parallelism in x direction of the ion beam 4 or the like is newly provided in order to measure the angle deviation $\theta_y$ in y direction, the diverging angle, and the beam size of the ion beam 4, (a) the measuring system is increased, the structure becomes complicated and also cost is considerably increased, (b) in measuring operation, an operation of interchanging the measuring system in x direction and the measuring system in y direction is obliged to be carried out with respect to the beam line of the ion beam 4, a time period required for the interchanging operation becomes an extra time period and the productivity is lowered.

DISCLOSURE OF THE INVENTION

It is an object of the invention to provide an ion beam measuring method capable of measuring at least one, preferably foregoing two, and further preferably three of angle deviation, a diverging angle and a beam size in y direction orthogonal to a direction of scanning an ion beam by a simple constitution.

Further, it is other object of the invention to provide an ion implanting apparatus capable of executing the ion beam measuring method by using a control apparatus.

An ion beam measuring method and an ion implanting apparatus according to the invention use a forestage multipoints Faraday and a poststage multipoints Faraday mentioned above. Further, the method and the apparatus are provided with a forestage beam restricting shutter provided at a vicinity of an upstream side of the forestage multipoints Faraday, capable of blocking the ion beam and having a side in parallel with the x direction, a forestage shutter driving apparatus for driving the forestage beam restricting shutter in y direction orthogonal to the x direction, a poststage beam restricting shutter provided at a vicinity on an upstream side of the poststage multipoints Faraday, capable of blocking the ion beam and having a side in parallel with the x direction, and a poststage shutter driving apparatus for driving the poststage beam restricting shutter in the y direction.

Further, in a first ion beam measuring method according to the invention, there are executed a poststage beam current density distribution measuring step of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus, a forestage center position calculating step of calculating a center position $y_{cf}$ in the y direction of the ion beam at the position of the forestage beam restricting shutter from the beam current density distribution calculated at the forestage beam current density distribution measuring step, a postage beam current density distribution measuring step of calculating a beam current density distribution in the y direction of the ion beam at a position of the poststage beam restricting shutter by measuring a change in the beam current of the ion beam incident on the poststage multipoints Faraday by passing an outer side of the side of the poststage beam restricting shutter while driving the poststage beam restricting shutter in the y direction by the poststage shutter driving apparatus, a poststage center position calculating step of calculating a center position $y_{cb}$ in the y direction of the ion beam at the position of the poststage beam restricting shutter from the beam current density distribution calculated at the poststage beam current density distribution measuring step, and an angle deviation calculating step of calculating an angle deviation $\theta_y$ in the y direction of the ion beam based on the following equation or an equation mathematically equivalent thereto by using the center position $y_{cf}$ calculated at the forestage center position calculating step, the center position $y_{cb}$ calculated at the poststage center position calculating step and a distance L between the forestage beam restricting shutter and the poststage beam restricting shutter.

$$\theta_y = \tan^{-1}\{(y_{cb} - y_{cf})/L\} \quad \text{[Equation 1]}$$

In a second ion beam measuring according to the invention, there are executed a poststage beam current density distribution measuring step of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus, a forestage beam size calculating step of calculating a beam size $d_{yf}$ in the y direction of the ion beam at the position of the forestage beam restricting shutter from the beam current density distribution calculated at the forestage beam current density distribution measuring step, a poststage beam current density distribution measuring step of calculating a beam current density distribution in the y direction of the ion beam at the position of the poststage beam restricting shutter by measuring a change in the beam current of the ion beam incident on the poststage multipoints Faraday by passing an outer side of the side of the poststage beam restricting shutter while driving the poststage beam restricting shutter in the y direction by the poststage shutter driving apparatus, a poststage beam size calculating step of calculating a beam size $d_{yb}$ in the y direction of the ion beam at the position of the poststage beam restricting shutter from the beam current density distribution calculated at the poststage beam current density distribution measuring step, and a diverging angle calculating step of calculating a diverging angle $\alpha_{max}$ in the y direction of the ion beam based on the following equation or an equation mathematically equivalent thereto by using the beam size $d_{yf}$ calculated at the forestage beam size calculating step, the beam size $d_{yb}$ calculated at the poststage beam size calculating step and a distance L between the forestage beam restricting shutter and the poststage beam restricting shutter.

$$\alpha_{max} = \tan^{-1}\{(d_{yb} - d_{yf})/2L\} \quad \text{[Equation 2]}$$

In a third ion beam measuring method according to the invention, there are executed a poststage beam current density distribution measuring step of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus, a forestage beam size calculating step of calculating a beam size $d_{yf}$ in the y direction of the ion beam at the position of the forestage beam restricting shutter from the beam current density distribution calculated at the forestage beam current density distribution measuring step, a poststage beam current density distribution measuring step of calculating a beam current density distribution in the y direction of the ion beam at the position of the poststage beam restricting shutter by measuring a change in the beam current of the ion beam incident on the poststage multipoints Faraday by passing an outer side of the side of the poststage beam restricting shutter while driving the poststage beam restricting shutter in the y direction by the poststage shutter driving apparatus, a poststage beam size calculating step of calculating a beam size $d_{yb}$ in the y direction of the ion beam at the position of the poststage beam restricting shutter from the beam current density distribution calculated at the poststage beam current density distribution measuring step, and a beam size calculating step of calculating a beam size $d_{yt}$ in the y direction of the ion beam on the target based on the following equation or an equation mathematically equivalent thereto by using the beam size $d_{yf}$ calculated at the forestage beam size calculating step, the beam size $d_{yb}$ calculated at the poststage beam calculating step, a distance L between the forestage beam restricting shutter and the poststage beam restricting shutter, a distance $L_1$ between the forestage beam restricting shutter and the target and a distance $L_2$ between the target and the poststage beam restricting shutter.

$$d_{yt} = (L_2/L)d_{yf} + (L_1/L)d_{yb}, \text{ (where } L = L_1 + L_2\text{)} \quad \text{[Equation 3]}$$

Further, in a fourth ion beam measuring method according to the invention, there are executed the forestage beam current density distribution measuring step, the forestage center position calculating step, the poststage beam current density distribution measuring step, the poststage center position calculating step, the angle deviation calculating step, the forestage beam size calculating step, the poststage beam size calculating step and the diverging angle calculating step.

Further, in a fifth ion beam measuring method according to the invention, there are executed the forestage beam current density distribution measuring step, the forestage center position calculating step, the poststage beam current density distribution measuring step, the postage center position calculating step, the angle deviation calculating step, the forestage beam size calculating step, the poststage beam size calculating step, the diverging angle calculating step and the beam size calculating step.

An ion implanting apparatus according to the invention is provided with a control apparatus for executing predetermined ones in processings in correspondence with the steps.

According to an ion implanting apparatus having the control apparatus for executing the first ion beam measuring method and predetermined ones in processings in correspondence with the steps of the method, the angle deviation $\theta_y$ in y direction orthogonal to the scanning direction of the ion beam can be measured. Further, the measurement is carried out by utilizing the forestage multipoints Faraday and the poststage multipoints Faraday provided for measuring a parallelism or the like in the scanning direction of the ion beam and therefore, it is not necessary to newly provide a Faraday measuring system. Therefore, the measurement can be carried out by a simple constitution. Further, it is not necessary to execute the operation of interchanging a measuring system in x direction and a measuring system in y direction relative to the beam line and therefore, an extra time period is reduced and productivity is promoted by that amount.

According to an ion implanting apparatus having a control apparatus for executing the second ion beam measuring method and predetermined ones of processings in correspondence with the steps of the method, the diverging angle αmax in y direction orthogonal to the scanning direction of the ion beam can be measured. Further, the measurement is carried by utilizing the forestage multipoints Faraday and the poststage multipoints Faraday provided for measuring a parallelism or the like in the scanning direction of the ion beam and therefore, it is not necessary to newly provide a Faraday measuring system. Therefore, the measurement can be carried out by a simple constitution. Further, it is not necessary to execute operation of interchanging a measuring system in x direction and a measuring system in y direction relative to the beam line and therefore, an extra time period is reduced and productivity is promoted by that amount.

According to an ion implanting apparatus having a control apparatus for executing the third ion beam measuring method and predetermined ones of processings in correspondence with the steps of the method, the beam size $d_{yt}$ in y direction of the ion beam on the target can be measured. Further, the measurement is carried out by utilizing the forestage multipoints Faraday and the poststage multipoints Faraday provided for measuring a parallelism or the like in the scanning direction of the ion beam and therefore, it is not necessary to newly provide a Faraday measuring system. Therefore, the measurement can be carried out by a simple constitution. Further, it is not necessary to execute operation of interchanging a measuring system in x direction and a measuring system in y direction relative to the beam line and therefore, an extra time period is reduced and productivity is promoted by that amount.

According to an ion implanting apparatus having a control apparatus for executing the fourth ion beam measuring method and predetermined ones of processings in correspondence with the steps of the method, the angle deviation $\theta_y$ in the y direction and the diverging angle $\alpha_{max}$ in the y direction can be measured by a simple constitution. Further, also productivity is promoted by reason similar to the above-described.

According to an ion implanting apparatus having a control apparatus for executing the fifth ion beam measuring method and predetermined ones of processings in correspondence with the steps of the method, the angle deviation in the y direction, the diverging angle $\alpha_{max}$ in the y direction and the beam size in y direction on the target can be measured by a simple constitution. Further, also productivity is promoted by reason similar to the above-described.

BRIEF DESCRIPTION OF THE DRAWINGS

FIG. 10(A) shows an incidence angle $\phi_x$ in x direction, and FIG. 10(B) shows an incidence angle $\phi_y$ in y direction.

Further, in notations in the drawings, numeral 4 designates the ion beam, numeral 16 designates the target, numeral 20 designates the target driving apparatus, numeral 24 designates the forestage multipoints Faraday, numeral 28 designates the poststage multipoints Faraday, numeral 32 designates the forestage beam restricting shutter, numerals 34 and 44 designate sides, numeral 36 designates the forestage shutter driving apparatus, numeral 42 designates a poststage beam restricting shutter, numeral 46 designates a poststage shutter driving apparatus, and numeral 50 designates a control apparatus.

BEST MODE FOR CARRYING OUT THE INVENTION

FIG. 7 is a view showing an essential portion of an embodiment of an ion implanting apparatus for embodying an ion beam measuring method according to the invention. A constitution of a total of the ion implanting apparatus refers to FIG. 1 and the explanation related thereto. Further, portions the same as or corresponding to those in the example shown in FIG. 1 are attached with the same notations and in the following, a difference thereof from those of the above-described example will mainly be explained.

The ion implanting apparatus includes the forestage multipoints Faraday 24 at a position $z_{ff}$ on an upstream side of the target 16 and includes the poststage multipoints Faraday 28 at a position $z_{fb}$ on a downstream side of the target 16 with regard to a position on z axis constituting an advancing direction of the ion beam 4. A position on z axis of the target 16 is designated by notation $z_t$. When the target 16 is inclined as in the example shown in FIG. 7, a position on z axis of a center of the target 16 is designated by notation $z_t$.

Further, the forestage beam restricting shutter 32 capable of blocking the ion beam 4 parallelly scanned in the x direction is provided at a position $z_f$ at a vicinity on an upstream side of the forestage multipoints Faraday 24. The forestage beam restricting shutter 32 includes the side 34 in parallel with the x direction. It is preferable to maintain the side 34 finely in parallel with the x direction. Although in this example, the forestage beam restricting shutter 32 is constituted by a rectangular shape prolonged in x direction, the shape of the forestage beam restricting shutter 32 is not limited thereto. Further, although in this example, the side 34 is a lower side of the forestage beam restricting shutter 32, the side 34 may be an upper side thereof.

There is provided the forestage shutter driving apparatus 36 for holding the forestage beam restricting shutter 32 and driving to reciprocate the forestage beam restricting shutter 32 in the y direction as shown by an arrow mark 38. In this example, the forestage shutter driving apparatus 36 includes a control circuit for finely controlling a position in y direction of the forestage beam restricting shutter 32 and a position sensor for finely measuring and outputting a position y1 in y direction of the side 34 (illustration of both of which is omitted).

The ion implanting apparatus is further provided with the poststage beam restricting shutter 42 capable of blocking the ion beam 4 parallelly scanned in the x direction at a position $z_b$ at a vicinity on an upstream side of the poststage multipoints Faraday 28, further specifically, at the position $z_b$ on a downstream side of the target 16 and at a vicinity on an upstream side of the poststage multipoints Faraday 28. The poststage beam restricting shutter 42 is provided with the side 44 in parallel with the x direction. It is preferable to maintain the side 44 finely in parallel with the x direction. Although in this example, the poststage beam restricting shutter 42 is constituted by a rectangular shape prolonged in x direction, a shape of the postage beam restricting shutter 42 is not limited thereto. Further, although in this example, the side 44 at a lower side of the poststage beam restricting shutter 42, the side 44 may be an upper side thereof.

There is provided the poststage shutter driving apparatus 46 for holding the poststage beam restricting shutter 42 and reciprocating to drive the poststage beam restricting shutter 42 in the y direction as shown an arrow mark 48. In this example, the poststage shutter driving apparatus 46 includes a control circuit for finely controlling a position in y direction of the poststage beam restricting shutter 42 and a position sensor for finely measuring and outputting a position $y_1$ in y direction of the side 44 (illustration of both of which is omitted).

Figure 6:
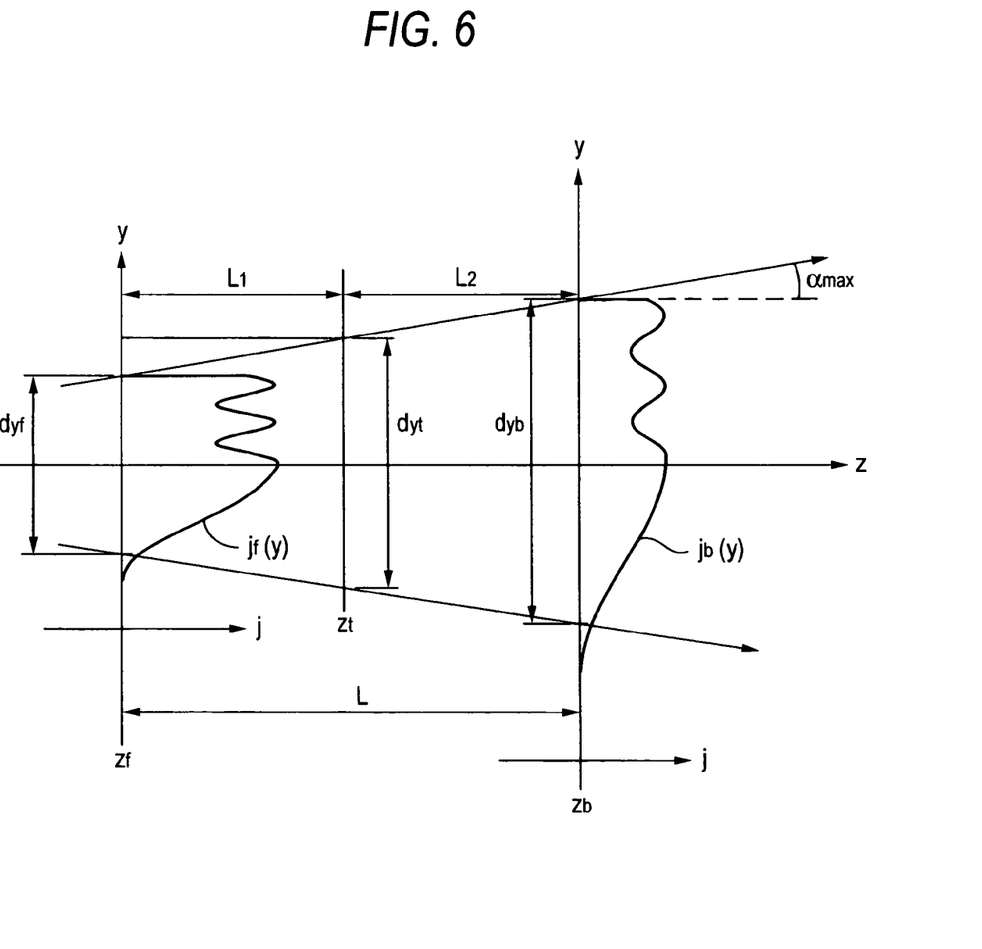
FIG. 6 is a diagram showing an example of a diverging angle $\alpha_{max}$ in y direction of the ion beam.

Also in reference to FIG. 6, a distance between the forestage beam restricting shutter 32 and the poststage beam restricting shutter 42 in a direction along x axis, that is, a distance between the position $z_f$ and the position $z_b$ is designated by notation L, a distance between the forestage beam restricting shutter 32 and the target 16, that is, a distance between the position $z_f$ and the position $z_t$ is designated by notation $L_1$, and a distance between the target 16 and the poststage beam restricting shutter 42, that is, a distance between the position $z_t$ and the position $z_b$ is designated by notation $L_2$. Therefore, $L=L_1+L_2$.

The embodiment is further provided with the control apparatus 50 for executing respective processings mentioned later.

The control apparatus 50 respectively drives the forestage beam restricting shutter 32, the poststage beam restricting shutter 42 as described above by respectively controlling the forestage shutter driving apparatus 36, the poststage shutter driving apparatus 46 and respectively receives information of the position $y_1$ from the forestage shutter driving apparatus 36, the poststage shutter driving apparatus 46. Further, the control apparatus 50 respectively receives information of beam currents $S_{f,i}$ (y), $S_{b,i}$ (y) mentioned later from the forestage multipoints Faraday 24, the poststage multipoints Faraday 28.

Further, the control apparatus 50 is provided with information of the distances L, $L_1$ and $L_2$ (for example, set therewith). However, calculation of $L=L_1+L_2$ may be executed in the control apparatus 50 without providing information of the distance L.

Here, definition of the center trajectory in y direction of the ion beam 4, the beam size and the diverging angle in the specification will be explained.

Figure 4:
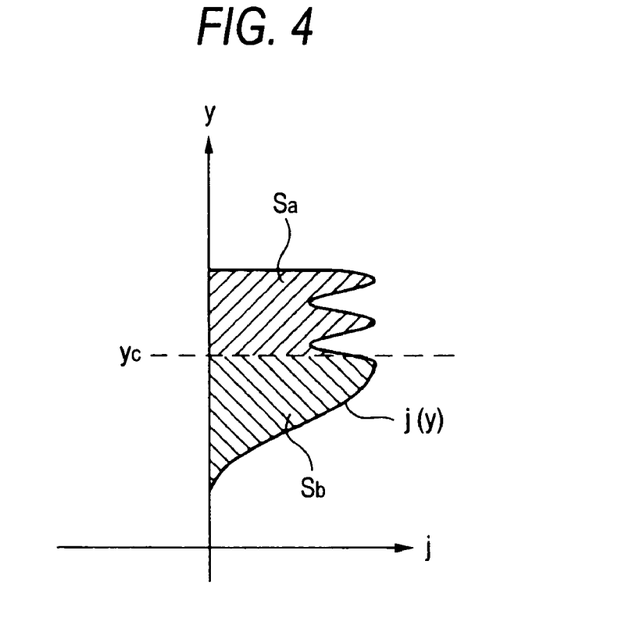
FIG. 4 is a diagram showing an example of a beam current density distribution j (y) in y direction of the ion beam.
Figure 5:
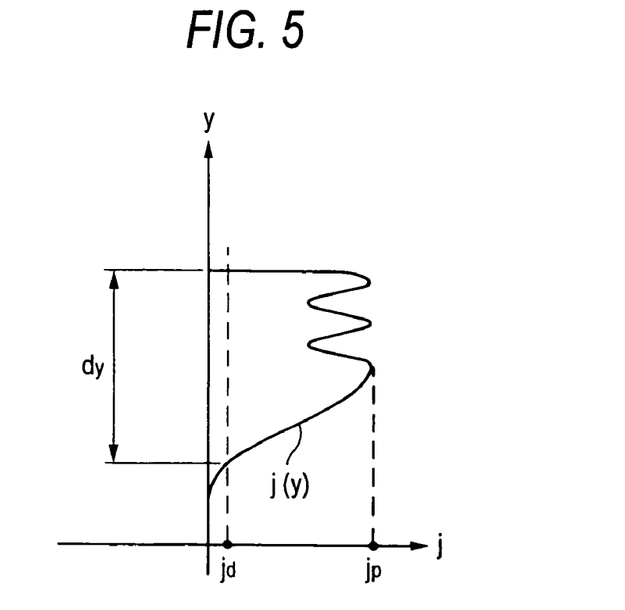
FIG. 5 is a diagram showing an example of a beam size $d_y$ in y direction of the ion beam.

FIG. 4 shows an example of a distribution of j (y) of a beam current density j in y direction of the ion beam 4. Generally, the beam current density j (y) is not necessarily limited to be a simple shape and therefore, here, a shape shown in FIG. 4 is taken up as an example. At this occasion, a center position of integration of the beam current density distribution j (y) is designated by notation $y_c$. That is, the center position $y_c$ is a position at which an area $S_a$ on an upper half and an area $S_b$ of a lower half which are hatched in FIG. 4 become equal to each other. A trajectory of the center position $y_c$ of the ion beam 4 is the center trajectory in y direction of the ion beam 4.

When the center position $y_c$ differs between two points remote from each other by a predetermined distance along z axis, specifically, when the center position $y_c$ differs between the position $z_f$ of the forestage beam restricting shutter 32 and the position $z_b$ of the poststage beam restricting shutter 42 (refer to FIG. 6, FIG. 7) which are remote from each other by the distance L, the center trajectory of the ion beam 4 is provided with the angle deviation $\theta_y$ in y direction. In this case, when the center positions $y_c$ of the ion beam 4 at the position $z_f$ of the forestage beam restricting shutter 32 and the position $z_b$ of the poststage beam restricting shutter 42 are respectively designated by notations $y_{cf}$, $y_{cb}$, the angle deviation $\theta_y$ is represented by Equation 1 mentioned above.

Next, the beam size in y direction of the ion beam 4 will be explained. In the example shown in FIG. 5, a maximum value of a beam current j in the beam current density distribution j (y) is designated by notation $j_p$, and a value thereof of a rate sufficiently smaller than the maximum value $j_p$, for example, 10% is designated by notation $j_d$. Further, a distance between two points disposed at upper and lower outermost sides in y direction of the beam current density distribution j (y) and at which a value of the beam current j traverses the above-described value $j_d$ is designated by notation $d_y$. $d_y$ is defined as a beam size in y direction of the ion beam 4.

Next, the diverging angle in y direction of the ion beam 4 will be explained. FIG. 6 shows an example of a beam current density distribution $j_f$ (y) at the position $z_f$ of the forestage beam restricting shutter 32 and an example of a beam current density distribution $j_b$ (y) at the position $z_b$ of the poststage in the restricting shutter 42. Generally speaking, the beam current density distribution j (y) differs by the position on z axis constituting the advancing direction of the ion beam 4 and therefore, also the beam size $d_y$ differs. This is because directions of moving individual ions constituting the ion beam 4 do not necessarily coincide with the direction of the center trajectory of the ion beam 4. Here, the beam size at the position $z_f$ of the forestage beam restricting shutter 32 is designated by notation $d_{yf}$ and the beam size at the position $z_b$ of the poststage in the restricting shutter 42 is designated by notation $d_{yb}$. Therefore when $d_{yf} < d_{yb}$, the ion beam 4 diverges in y direction between the two positions $z_f$, $z_b$ and when $d_{yf} > d_{yb}$, the ion beam 4 converges. When a diverging angle in y direction of the ion beam 4 between the two positions $z_f$, $z_b$ is designated by notation $\alpha_{max}$, the diverging angle $\alpha_{max}$ is represented by Equation 2 mentioned above.

Further, the beam size $d_{yt}$ in y direction on the target 16 is represented by Equation 3 mentioned above.

Next, a method of measuring the angle deviation $\theta_y$, the diverging angle $\alpha_{max}$ and the beam size $d_{yt}$ represented as described above will be explained.

It is preferable to adjust the parallelism $\theta_x$ in x direction of the ion beam 4 to a desired value, for example, $\theta_x \approx 0°$ in accordance with a technology described in, for example, Patent Reference 2 or a technology similar thereto prior to the measurement.

Figure 8:
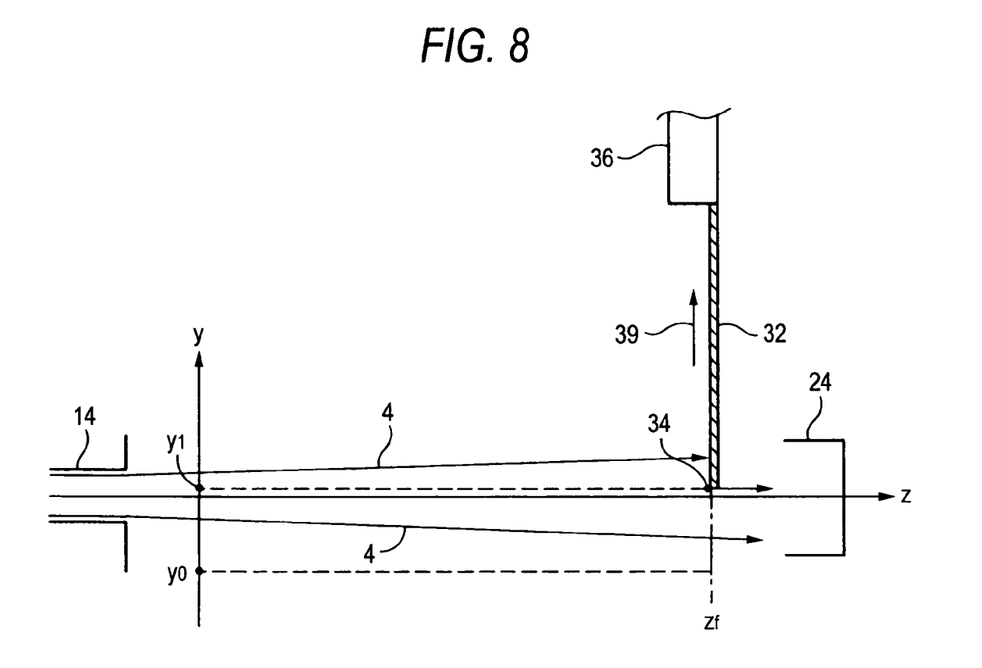
FIG. 8 is a view showing an example of a method of measuring the beam current density distribution in y direction at a position of a forestage beam restricting shutter.

In the measurement, as shown by FIG. 8, the forestage multipoints Faraday 24 is disposed on a path of the ion beam 4, the beam current of the ion beam 4 incident on the forestage multipoints Faraday 24 is measured by the forestage multipoints Faraday 24 by driving the forestage beam restricting shutter 32 in y direction by the forestage shutter driving apparatus 36. In driving the forestage beam restricting shutter 32, although the forestage beam restricting shutter 32 may be driven from a state in which the ion beam 4 is not blocked at all to a state of blocking the ion beam 4, here, an explanation will be given by taking an example of driving the forestage beam restricting shutter 32 from a state of completely blocking the ion beam 4 to a state in which the ion beam 4 is not blocked. A direction of driving the forestage beam restricting shutter 32 is designated by an arrow mark 39. In this case, at first, the ion beam 4 is completely blocked by forestage beam restricting shutter 32 and therefore, the ion beam 4 is not incident on the forestage multipoints Faraday 24 at all. A y coordinate position of the side 34 of the forestage beam restricting shutter 32 at this occasion is designated by notation $y_0$.

Further, when the forestage beam restricting shutter 32 is driven in y direction as shown by the arrow mark 39, with progress of driving, a portion of the ion beam 4 which has been blocked by the forestage beam restricting shutter 32 is gradually incident on the forestage multipoints Faraday 24 by passing an outer side of the side 34. Here, a y coordinate position of the side 34 of the forestage beam restricting shutter 32 when at least a portion of the ion beam 4 is incident on the forestage multipoints Faraday 24 is designated by notation $y_1$.

Figure 9:
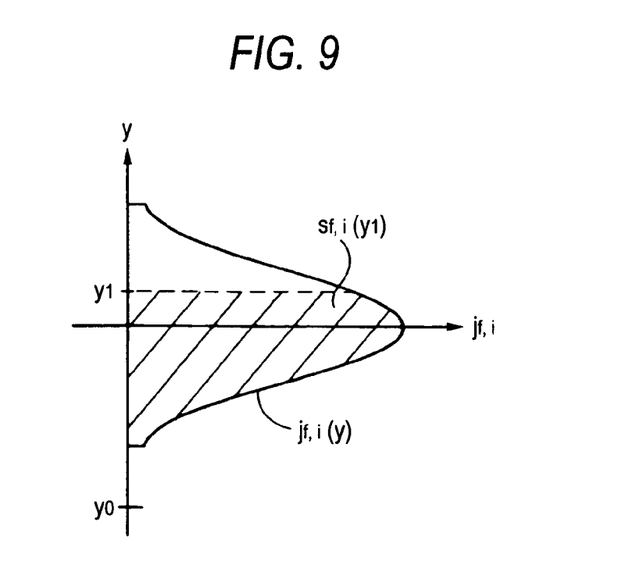
FIG. 9 is a diagram showing an example of the beam current density distribution in y direction at a position of the forestage beam restricting shutter.

Now, attention is paid to an i-th detector (for example, Faraday Cup) in x direction of the forestage multipoints Faraday 24 and an x coordinate position of the center is designated by notation $x_i$. At this occasion, a function representing the beam current density distribution $j_f(y)$ in y direction at the x coordinate $x_i$ is defined as $j_{f,i}$ (y) at the position $z_f$ of the forestage beam restricting shutter 32. At this occasion, the beam current $S_{f,i}$ (y) measured by the i-th detector is represented by Equation 4 shown below. FIG. 9 illustrates the beam current. In this case, the beam current density $j_{f,i}$ is set to null at $y_0$ or less.

$$S_{f,j}(y_1) = \int_{y_0}^{y_1} j_{f,i}(y)\,dy \quad \text{[Equation 4]}$$

Therefore, the beam current density distribution $j_{f,i}$ (y) in y direction of the ion beam 4 at position $z_f$, $x_i$ can be calculated by measuring the beam current $S_{f,i}$ (y) by the forestage multipoints Faraday 24 while driving the forestage beam restricting shutter 32 in y direction by the forestage shutter driving apparatus 36 and from a change rate represented by the following equation. This is a step of measuring a forestage beam current density distribution and the step is executed.

$$dS_{f,i}(y)/dy = j_{f,i}(y) \quad \text{[Equation 5]}$$

A beam current density distribution $j_{b,i}$ (y) in y direction of the ion beam 4 at position $z_b$, $x_i$ can be calculated by using the poststage multipoint Faraday 28, the poststage beam restricting shutter 42 and the poststage shutter driving apparatus 46 by a method similar to the above-described. This is a step of measuring a poststage beam current density distribution and the step is executed. Further, in measuring at the poststage, so as not to constitute a hindrance of the measurement, the forestage beam restricting shutter 32, the forestage multipoints Faraday 24 and the target 16 are placed outside of the path of the ion beam 4. The control may be executed by the control apparatus 50. In this case, the forestage multipoints Faraday 24 may be placed outside of the path of the ion beam 4 by using a driving apparatus, not illustrated.

Further, from the beam current density distributions $j_{f,i}$ (y), $j_{b,i}$ (y) calculated as described above, center positions $y_{cf}$, $y_{cb}$ in y direction of the ion beam 4 at the respective positions $z_f$, $z_b$ of the forestage beam restricting shutter 32, the poststage beam restricting shutter 42 are respectively calculated. The definition of the center position in y direction of the ion beam 4 has previously been explained in reference to FIG. 4. This is a step of calculating a forestage center position and a step of calculating a poststage center position.

Further, by using the center positions $y_{cf}$, $y_{cb}$ calculated as described above and the distance L, based on Equation 1 or an equation mathematically equivalent thereto, the angle deviation $\theta_y$ in y direction of the ion beam 4 is calculated. This is a step of calculating an angle deviation. Thereby, a situation of the center trajectory in y direction of the ion beam 4 can be known.

Further, according to the embodiment, the control apparatus 50 can execute a processing of measuring the forestage beam current density distribution having a content the same as the step of measuring the forestage beam current density distribution, a processing of measuring a poststage beam current density distribution having a content the same as the step of measuring the forestage beam current density distribution, a processing of calculating a forestage center position having a content the same as the step of calculating the forestage center position, a processing of calculating a poststage center position having a content the same as the step of calculating the poststage center position and a processing an angle deviation having a content the same as the step of calculating the angle deviation.

Further, as needed, from the beam current density distributions $j_{f,i}$ (y), $j_{b,i}$ (y) calculated as described above, beam sizes $d_{yf}$, $d_{yb}$ in y direction of the ion beam 4 at the respective positions $z_f$, $z_b$ of the forestage beam restricting shutter 32, the poststage beam restricting shutter 42 are respectively calculated. The definition of the beam size in y direction of the ion beam 4 has previously been explained in reference to FIG. 5 and FIG. 6. This is a step of calculating a forestage beam size and a step of calculating a poststage beam size.

Further, as needed, by using the beam sizes $d_{yf}$, $d_{yb}$ calculated as described above and the distance L, based on Equation 2 or an equation mathematically equivalent thereto, the diverging angle $\alpha_{max}$ in y direction of the ion beam 4 is calculated. The definition of the diverging angle $\alpha_{max}$ has previously been explained in reference to FIG. 6. This is a step of calculating a diverging angle.

Further, as needed, by using the beam sizes $d_{yf}$, $d_{yb}$ calculated as described above, the distances L, $L_1$, and $L_2$, based on Equation 3 or an equation mathematically equivalent thereto, the beam size $d_{yt}$ in y direction of the ion beam 4 on the target 16 (also refer to FIG. 6) is calculated. This is a step of calculating a beam size.

Further, as needed, the control apparatus 50 may be made to execute a processing of calculating a forestage beam size having a content the same as the step of calculating the forestage beam size, a processing of calculating a poststage beam size having a content the same as the step of calculating the poststage beam size, a step of calculating a diverging angle having a content the same as the step of calculating the diverging angle and a processing of calculating a beam size having a content the same as the step of calculating the beam size, and according to the embodiment, the control apparatus 50 can also execute the processings.

Further, when the forestage multipoints Faraday 24 includes n pieces (n is an integer equal to or larger than 2) of detectors in x direction, the notation i designates an arbitrary number from 1 to n. The same goes with the poststage multipoints Faraday 28. Therefore, by using a detector of an arbitrary number in 1 through n in x direction, at the position of the detector, measurement similar to the above-described can be carried out.

Although the invention has been explained in details and in reference to the specific embodiment, it is apparent for the skilled person that the invention can variously be changed or modified without deviating from the spirit and the range of the invention.

The application is based on Japanese Patent Application (Japanese Patent Application No. 2004-001006) filed on Jan. 6, 2004 and a content thereof is incorporated herein by reference.

The invention claimed is:

1. A method of measuring an ion beam performed in an ion implanting apparatus for irradiating an ion beam to a target by parallelly scanning the ion beam in an x direction, said ion implanting apparatus including a forestage multipoints Faraday and a poststage multipoints Faraday constituted by respectively installing pluralities of detectors for measuring a beam current of the ion beam parallelly in the x direction respectively on an upstream side and a downstream side of the target, said ion implanting apparatus further comprising: a forestage beam restricting shutter provided at a vicinity on an upstream side of the forestage multipoints Faraday, capable of blocking the ion beam and having a side in parallel with the x direction; a forestage shutter driving apparatus for driving the forestage beam restricting shutter in a y direction orthogonal to the x direction; a poststage beam restricting shutter provided at a vicinity on an upstream side of the poststage multipoints Faraday, capable of blocking the ion beam and having a side in parallel with the x direction; and a poststage shutter driving apparatus for driving the poststage beam restricting shutter in the y direction, said method comprising:

a poststage beam current density distribution measuring step of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus;

a forestage center position calculating step of calculating a center position $y_{cf}$ in the y direction of the ion beam at the position of the forestage beam restricting shutter from the beam current density distribution calculated at the forestage beam current density distribution measuring step;

a postage beam current density distribution measuring step of calculating a beam current density distribution in the y direction of the ion beam at a position of the poststage beam restricting shutter by measuring a change in the beam current of the ion beam incident on the poststage multipoints Faraday by passing an outer side of the side of the poststage beam restricting shutter while driving the poststage beam restricting shutter in the y direction by the poststage shutter driving apparatus;

a poststage center position calculating step of calculating a center position $y_{cb}$ in the y direction of the ion beam at the position of the poststage beam restricting shutter from the beam current density distribution calculated at the poststage beam current density distribution measuring step; and an angle deviation calculating step of calculating an angle deviation $\theta_y$ in the y direction of the ion beam based on the following equation or an equation mathematically equivalent thereto by using the center position $y_{cf}$ calculated at the forestage center position calculating step, the center position $y_{cb}$ calculated at the poststage center position calculating step and a distance L between the forestage beam restricting shutter and the poststage beam restricting shutter $$\theta_y = \tan^{-1}\{(y_{cb} - y_{cf})/L\}.$$

2. A method of measuring an ion beam performed in an ion implanting apparatus for irradiating an ion beam to a target by parallelly scanning the ion beam in an x direction, said ion implanting apparatus including a forestage multipoints Faraday and a poststage multipoints Faraday constituted by respectively installing pluralities of detectors for measuring a beam current of the ion beam parallelly in the x direction respectively on an upstream side and a downstream side of the target, said ion implanting apparatus further comprising: a forestage beam restricting shutter provided at a vicinity on an upstream side of the forestage multipoints Faraday, capable of blocking the ion beam and having a side in parallel with the x direction; a forestage shutter driving apparatus for driving the forestage beam restricting shutter in a y direction orthogonal to the x direction; a poststage beam restricting shutter provided at a vicinity on an upstream side of the poststage multipoints Faraday, capable of blocking the ion beam and having a side in parallel with the x direction; and a poststage shutter driving apparatus for driving the poststage beam restricting shutter in the y direction, said method comprising:

a poststage beam current density distribution measuring step of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus;

a forestage beam size calculating step of calculating a beam size $d_{yf}$ in the y direction of the ion beam at the position of the forestage beam restricting shutter from the beam current density distribution calculated at the forestage beam current density distribution measuring step;

a poststage beam current density distribution measuring step of calculating a beam current density distribution in the y direction of the ion beam at the position of the poststage beam restricting shutter by measuring a change in the beam current of the ion beam incident on the poststage multipoints Faraday by passing an outer side of the side of the poststage beam restricting shutter while driving the poststage beam restricting shutter in the y direction by the poststage shutter driving apparatus;

a poststage beam size calculating step of calculating a beam size $d_{yb}$ in the y direction of the ion beam at the position of the poststage beam restricting shutter from the beam current density distribution calculated at the poststage beam current density distribution measuring step; and a diverging angle calculating step of calculating a diverging angle $\alpha_{max}$ in the y direction of the ion beam based on the following equation or an equation mathematically equivalent thereto by using the beam size $d_{yf}$ calculated at the forestage beam size calculating step, the beam size $d_{yb}$ calculated at the poststage beam size calculating step and a distance L between the forestage beam restricting shutter and the poststage beam restricting shutter $\alpha_{max} = \tan^{-1}\{(d_{yb}-d_{yf})/2L\}$.

3. A method of measuring an ion beam performed in an ion implanting apparatus for irradiating an ion beam to a target by parallelly scanning the ion beam in an x direction, said ion implanting apparatus including a forestage multipoints Faraday and a poststage multipoints Faraday constituted by respectively installing pluralities of detectors for measuring a beam current of the ion beam parallelly in the x direction respectively on an upstream side and a downstream side of the target, said ion implanting apparatus further comprising: a forestage beam restricting shutter provided at a vicinity on an upstream side of the forestage multipoints Faraday, capable of blocking the ion beam and having a side in parallel with the x direction; a forestage shutter driving apparatus for driving the forestage beam restricting shutter in a y direction orthogonal to the x direction; a poststage beam restricting shutter provided at a vicinity on an upstream side of the poststage multipoints Faraday, capable of blocking the ion beam and having a side in parallel with the x direction; and a poststage shutter driving apparatus for driving the poststage beam restricting shutter in the y direction, said method comprising:

a poststage beam current density distribution measuring step of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus;

a forestage beam size calculating step of calculating a beam size $d_{yf}$ in the y direction of the ion beam at the position of the forestage beam restricting shutter from the beam current density distribution calculated at the forestage beam current density distribution measuring step;

a poststage beam current density distribution measuring step of calculating a beam current density distribution in the y direction of the ion beam at the position of the poststage beam restricting shutter by measuring a change in the beam current of the ion beam incident on the poststage multipoints Faraday by passing an outer side of the side of the poststage beam restricting shutter while driving the poststage beam restricting shutter in the y direction by the poststage shutter driving apparatus;

a poststage beam size calculating step of calculating a beam size $d_{yb}$ in the y direction of the ion beam at the position of the poststage beam restricting shutter from the beam current density distribution calculated at the poststage beam current density distribution measuring step; and a beam size calculating step of calculating a beam size $d_{yt}$ in the y direction of the ion beam on the target based on the following equation or an equation mathematically equivalent thereto by using the beam size $d_{yf}$ calculated at the forestage beam size calculating step, the beam size $d_{yb}$ calculated at the poststage beam calculating step, a distance L between the forestage beam restricting shutter and the poststage beam restricting shutter, a distance $L_1$ between the forestage beam restricting shutter and the target and a distance $L_2$ between the target and the poststage beam restricting shutter $d_{yt}=(L_2/L)d_{yf}+(L_1/L)d_{yb}$, (where $L=L_1+L_2$).

4. The method of measuring an ion beam according to claim 1, characterized in further comprising:

a forestage beam size calculating step of calculating a beam size $d_{yf}$ in the y direction of the ion beam at the position of the forestage beam restricting shutter from the beam current density distribution calculated at the forestage beam current density distribution measuring step;

a poststage beam size calculating step of calculating a beam size $d_{yb}$ in the y direction of the ion beam at the position of the poststage beam restricting shutter from the beam current density distribution calculated at the poststage beam current density distribution measuring step; and a diverging angle calculating step of calculating a diverging angle $\alpha_{max}$ in the y direction of the ion beam based on the following equation or an equation mathematically equivalent thereto by using the beam size $d_{yf}$ calculated at the forestage beam size calculating step, the beam size $d_{yb}$ calculated at the poststage beam size calculating step and a distance L between the forestage beam restricting shutter and the poststage beam restricting shutter $$\alpha_{max} = \tan^{-1}\{(d_{yb} - d_{yf})/2L\}.$$

5. The method of measuring an ion beam according to claim 4, characterized in further comprising:
a beam size calculating step of calculating a beam size $d_{yt}$ in the y direction of the ion beam on the target based on the following equation or an equation mathematically equivalent thereto by using the beam size $d_{yf}$ calculated at the forestage beam size calculating step, the beam size $d_{yb}$ calculated at the poststage beam size calculating step, the distance L between the forestage beam restricting shutter and the poststage beam restricting shutter, a distance $L_1$ between the forestage beam restricting shutter and the target and a distance $L_2$ between the target and the poststage beam restricting shutter $$d_{yt} = (L_2/L)d_{yf} + (L_1/L)d_{yb}, \text{ (where } L = L_1 + L_2).$$

6. An ion implanting apparatus for irradiating an ion beam to a target by parallelly scanning the ion beam in an x direction, said ion implanting apparatus including a forestage multipoints Faraday and a poststage multipoints Faraday constituted by respectively installing pluralities of detectors for measuring a beam current of the ion beam parallelly in the x direction respectively on an upstream side and a downstream side of the target, said ion implanting apparatus comprising:
a forestage beam restricting shutter provided at a vicinity on an upstream side of the forestage multipoints Faraday, capable of blocking the ion beam and having a side in parallel with the x direction;
a forestage shutter driving apparatus for driving the forestage beam restricting shutter in a y direction orthogonal to the x direction;
a poststage beam restricting shutter provided at a vicinity on an upstream side of the poststage multipoints Faraday, capable of blocking the ion beam and having a side in parallel with the x direction; and
a poststage shutter driving apparatus for driving the poststage beam restricting shutter in the y direction, further comprising:
a control apparatus for executing (a) a forestage beam current density measuring processing of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus, (b) a center position calculating step of calculating a center position $y_{cf}$ in the y direction of the ion beam at the position of the forestage beam restricting shutter from the beam current density distribution calculated at the forestage beam current distribution measuring processing, (c) a postage beam current density distribution measuring processing of calculating a beam current density distribution in the y direction of the ion beam at a position of the poststage beam restricting shutter by measuring a change in the beam current of the ion beam incident on the poststage multipoint Faraday by passing an outer side of the side of the poststage beam restricting shutter while driving the poststage beam restricting shutter in the y direction by the poststage shutter driving apparatus, (d) a poststage center position calculating step of calculating a center position $y_{cb}$ in the y direction of the ion beam at the position of the poststage beam restricting shutter from the beam current density distribution calculated at the poststage beam current density distribution measuring step, and (e) an angle deviation calculating processing of calculating an angle deviation $\theta_y$ in the y direction of the ion beam based on the following equation or an equation mathematically equivalent thereto by using the center position $y_{cf}$ calculated at the forestage center position calculating processing, the center position $y_{cb}$ calculated at the poststage center position calculating processing and a distance L between the forestage beam restricting shutter and the poststage beam restricting shutter $$\theta_y = \tan^{-1}\{(y_{cb} - y_{cf})/L\}.$$

7. An ion implanting apparatus for irradiating an ion beam to a target by parallelly scanning the ion beam in an x direction, said ion implanting apparatus including a forestage multipoints Faraday and a poststage multipoints Faraday constituted by respectively installing pluralities of detectors for measuring a beam current of the ion beam parallelly in the x direction respectively on an upstream side and a downstream side of the target, said ion implanting apparatus comprising:
a forestage beam restricting shutter provided at a vicinity on an upstream side of the forestage multipoints Faraday, capable of blocking the ion beam and having a side in parallel with the x direction;
a forestage shutter driving apparatus for driving the forestage beam restricting shutter in a y direction orthogonal to the x direction;
a poststage beam restricting shutter provided at a vicinity on an upstream side of the poststage multipoints Faraday, capable of blocking the ion beam and having a side in parallel with the x direction; and
a poststage shutter driving apparatus for driving the poststage beam restricting shutter in the y direction, further comprising:
a control apparatus for executing (a) a forestage beam current density measuring processing of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus, (b) a forestage beam size calculating processing of calculating a beam size $d_{yf}$ in the y direction of the ion beam at a position of the forestage beam restricting shutter from the beam current density distribution calculated at the forestage beam current density distribution measuring step, (c) a poststage beam current density distribution measuring processing of calculating a beam current density distribution in the y direction of the ion beam at a position of the poststage beam restricting shutter by measuring a change in the beam current of the ion beam incident on the poststage multipoints Faraday by passing an outer side of the side of the poststage beam restricting shutter by driving the poststage beam restricting shutter in the y direction by the poststage shutter driving apparatus, (d) a poststage beam current beam size calculating processing of calculating a beam size $d_{yb}$ in the y direction of the ion beam at the position of the poststage beam restricting shutter from the beam current density distribution calculated at the poststage beam current density distribution measuring processing, and (e) a diverging angle calculating processing of calculating a diverging angle $\alpha_{max}$ in the y direction of the ion beam based on the following equation or an equation mathematically equivalent thereto by using the beam size $d_{yf}$ calculated at the forestage beam size calculating processing, the beam size $d_{yb}$ calculated at the poststage beam size calculating processing and a distance L between the forestage beam restricting shutter and the postage beam restricting shutter $$\alpha_{max}=\tan^{-1}\{(d_{yb}-d_{yf})/2L\}.$$

8. An ion implanting apparatus for irradiating an ion beam to a target by parallelly scanning the ion beam in an x direction, said ion implanting apparatus including a forestage multipoints Faraday and a poststage multipoints Faraday constituted by respectively installing pluralities of detectors for measuring a beam current of the ion beam parallelly in the x direction respectively on an upstream side and a downstream side of the target, said ion implanting apparatus comprising:
  a forestage beam restricting shutter provided at a vicinity on an upstream side of the forestage multipoints Faraday, capable of blocking the ion beam and having a side in parallel with the x direction;
  a forestage shutter driving apparatus for driving the forestage beam restricting shutter in a y direction orthogonal to the x direction;
  a poststage beam restricting shutter provided at a vicinity on an upstream side of the poststage multipoints Faraday, capable of blocking the ion beam and having a side in parallel with the x direction; and
  a poststage shutter driving apparatus for driving the poststage beam restricting shutter in the y direction, further comprising:
  a control apparatus for executing (a) a forestage beam current density measuring processing of calculating a beam current density distribution in the y direction of the ion beam at a position of the forestage beam restricting shutter by measuring a change in the beam current of the ion beam incident on the forestage multipoints Faraday by passing an outer side of the side of the forestage beam restricting shutter while driving the forestage beam restricting shutter in the y direction by the forestage shutter driving apparatus, (b) a forestage beam size calculating processing of calculating a beam size $d_{yf}$ in the y direction of the ion beam at a position of the forestage beam restricting shutter from the beam current density distribution calculated at the forestage beam current density distribution measuring step, (c) a poststage beam current density distribution measuring processing of calculating a beam current density distribution in the y direction of the ion beam at a position of the poststage beam restricting shutter by measuring a change in the beam current of the ion beam incident on the poststage multipoints Faraday by passing an outer side of the side of the poststage beam restricting shutter by driving the poststage beam restricting shutter in the y direction by the poststage shutter driving apparatus, (d) a poststage beam current beam size calculating processing of calculating a beam size $d_{yb}$ in the y direction of the ion beam at the position of the poststage beam restricting shutter from the beam current density distribution calculated at the poststage beam current density distribution measuring processing, and (e) a beam size calculating step of calculating a beam size $d_{yt}$ in the y direction of the ion beam on the target based on the following equation or an equation mathematically equivalent thereto by using the beam size $d_{yf}$ calculated at the forestage beam size calculating processing, the beam size $d_{yb}$ calculated at the poststage beam size calculating processing, a distance between the forestage beam restricting shutter and the poststage beam restricting shutter, a distance $L_1$ between the forestage beam restricting shutter and the target and a distance $L_2$ between the target and the poststage beam restricting shutter $$d_{yt}=(L_2/L)d_{yf}+(L_1/L)d_{yb}, \text{ (where } L=L_1+L_2\text{)}.$$

9. The ion implanting apparatus according to claim 6, characterized in that the control apparatus further executes (a) a forestage beam size calculating processing of calculating a beam size $d_{yf}$ in the y direction of the ion beam at the position of the forestage beam restricting shutter from the beam current density distribution calculated at the forestage beam current density distribution measuring processing, (b) a poststage beam size calculating processing of calculating a beam size $d_{yb}$ in the y direction of the ion beam at the position of the poststage beam restricting shutter from the beam current density distribution calculated at the poststage beam current density distribution measuring processing, and (c) a diverging angle calculating processing of calculating a diverging angle $\alpha_{max}$ in the y direction of the ion beam based on the following equation or an equation mathematically equivalent thereto by using the beam size $d_{yf}$ calculated at the forestage beam size calculating processing, the beam size $d_{yb}$ calculated at the poststage beam size calculating processing and a distance L between the forestage beam restricting shutter and the poststage beam restricting shutter $$\alpha_{max}=\tan^{-1}\{(d_{yb}-d_{yf})/2L\}.$$

10. The ion implanting apparatus according to claim 9, characterized in that the control apparatus further executes a beam size calculating processing of calculating a beam size $d_{yt}$ in the y direction of the ion beam on the target based on the following equation or an equation mathematically equivalent thereto by using the beam size $d_{yf}$ calculated at the forestage beam size calculating processing, the beam size $d_{yb}$ calculated at the poststage beam size calculating processing, the distance L between the forestage beam restricting shutter and the poststage beam restricting shutter, a distance $L_1$ between the forestage beam restricting shutter and the target and a distance $L_2$ between the target and the poststage beam restricting shutter $$d_{yt}=(L_2/L)d_{yf}+(L_1/L)d_{yb}, \text{ (where } L=L_1+L_2\text{)}.$$

* * * * *